(12) United States Patent
Nakamura et al.

(10) Patent No.: US 7,728,685 B2
(45) Date of Patent: Jun. 1, 2010

(54) TEMPERATURE COMPENSATION OSCILLATOR AND METHOD FOR MANUFACTURING THE SAME

(75) Inventors: Rikoku Nakamura, Tokyo (JP); Takuo Furuki, Sayama (JP); Takashi Masuda, Tokyo (JP)

(73) Assignees: Citizen Holdings Co., Ltd., Tokyo (JP); Citizen Finetech Miyota Co., Ltd., Kitasaku-gun (JP)

( * ) Notice: Subject to any disclaimer, the term of this patent is extended or adjusted under 35 U.S.C. 154(b) by 49 days.

(21) Appl. No.: 12/092,772

(22) PCT Filed: Nov. 6, 2006

(86) PCT No.: PCT/JP2006/322085

§ 371 (c)(1),
(2), (4) Date: May 6, 2008

(87) PCT Pub. No.: WO2007/052788

PCT Pub. Date: May 10, 2007

(65) Prior Publication Data

US 2009/0115542 A1    May 7, 2009

(30) Foreign Application Priority Data

Nov. 7, 2005    (JP)    ............... 2005-322523

(51) Int. Cl.
*H03L 1/02*   (2006.01)
*H03B 5/32*   (2006.01)

(52) U.S. Cl. .................... 331/176; 331/117 V; 331/158

(58) Field of Classification Search ............. 331/116 R, 331/116 FE, 158, 176, 66, 177 V, 44
See application file for complete search history.

(56) References Cited

U.S. PATENT DOCUMENTS 7,123,105 B2 * 10/2006 Kim et al. ...................... 331/66
7,205,858 B2 *  4/2007 Kato ........................... 331/158

(Continued)

FOREIGN PATENT DOCUMENTS

JP    2002-151957 A    5/2002

(Continued)

OTHER PUBLICATIONS

International Search Report of PCT/JP2006/322085, date of mailing Jan. 23, 2007.

*Primary Examiner*—Robert Pascal
*Assistant Examiner*—Ryan J Johnson
(74) *Attorney, Agent, or Firm*—Westerman, Hattori, Daniels & Adrian, LLP

(57) ABSTRACT

A temperature detection circuit (18) detects temperature around an oscillation circuit (20) equipped with voltage variable capacitors (23, 24). According to its temperature detection signal, a temperature compensation circuit (30) produces a voltage signal as a temperature compensation signal. That voltage signal is supplied to the voltage variable capacitors (23, 24) in order to sustain oscillation frequency of the oscillation circuit (20) at a substantially constant level. When a switch element (1) is turned on by a non-TCXO signal, both terminals of each voltage variable capacitor (23, 24) are brought to the same potential (ground potential). Consequently, each voltage variable capacitor has a predetermined capacitance and temperature compensation function is made ineffective. In that state, initial frequency regulation is performed under normal temperature.

13 Claims, 7 Drawing Sheets

U.S. PATENT DOCUMENTS

2005/0040904 A1 2/2005 Sakurai

FOREIGN PATENT DOCUMENTS

| JP | 03-218636 A | 7/2003 |
| JP | 2004-147180 A | 5/2004 |
| WO | 03 063335 A1 | 7/2003 |
| WO | WO 2005020427 A1 * | 3/2005 |

* cited by examiner

TEMPERATURE COMPENSATION OSCILLATOR AND METHOD FOR MANUFACTURING THE SAME

TECHNICAL FIELD

The present invention relates to a temperature compensation oscillator in which the frequency of an output signal is kept substantially constant irrespective of a change in ambient temperature and, more specifically, to a temperature compensation oscillator in which its temperature compensation function can also be disabled and a method for manufacturing the same.

BACKGROUND TECHNOLOGY

Temperature compensation oscillators (TCXOs) used in various fields are in heavy use in portable mobile communication devices such as a cellular phone and so on in recent years. Generally, as this kind of temperature compensation oscillator, a crystal oscillator is widely used in which an oscillation circuit is constituted of a 10 MHz band AT cut quartz crystal (resonator) as an oscillation source and provided with a temperature compensation circuit so that the temperature characteristic in a cubic curve of the AT cut quartz crystal is cancelled to stabilize the oscillating frequency.

For these kinds of temperature compensation oscillators, a reduction in size and weight and a reduction in price as well as stability of an oscillation output signal are desired. For these needs, several types of packages are known. For example, the packages include a single type in which a quartz crystal (piezoelectric element) being a resonator and an integrated circuit constituting the temperature compensation circuit are mounted in the same chamber in the package, a double type in which a quartz crystal and an integrated circuit are separately packaged and bonded together, and an H type in which a quartz crystal and an integrated circuit are mounted in front and back separate chambers with a middle partition held therebetween.

A package configuration example of a single-type surface-mounted temperature compensation oscillator is now shown in FIG. 14.

This temperature compensation oscillator has a package (container) 10 which is constituted of a package main body 11, a welded ring 12, and a cover 13, to the inside of which a quartz crystal 15, and a MOS IC (integrated circuit) chip 16 constituting an oscillation circuit and a temperature compensation circuit which will be later described are attached and sealed in the same chamber. Note that, in addition to the IC chip 16, a circuit element such as a chip capacitor or the like may also be mounted in the package main body 11.

The temperature compensation oscillator has a circuit configuration as shown in FIG. 15. An oscillation circuit 20 forms an inverter oscillation circuit in which the quartz crystal 15 being a piezoelectric element, an inverter 21, and a feedback resistor 22 are connected in parallel, and their both connection points are grounded via DC cut capacitors Cc and Cd and voltage variable capacitors (voltage-controlled variable capacitance condensers) 23 and 24 which are oscillation capacitors, respectively. An oscillation output signal is outputted from the connection point on the output side of the inverter 21 to an output terminal 26.

Furthermore, a temperature detection circuit 18 which detects the temperature state near the quartz crystal 15 in the oscillation circuit 20 and a temperature compensation circuit 30 which controls to keep the oscillation frequency of the oscillation circuit 20 substantially constant based on a temperature detection signal from the temperature detection circuit 18, are provided.

The temperature compensation circuit 30 comprises a compensation data storage circuit (non-volatile memory) 31 which stores compensation data and a D/A conversion circuit 32 which generates a voltage signal as a temperature compensation signal based on the compensation data and the temperature detection signal from the temperature detection circuit 18. Then, the voltage signal is applied to terminals on the non-grounded side of the voltage variable capacitors 23 and 24 via resistors R1 and R2 provided in the oscillation circuit 20 respectively, so as to change the capacitances of the voltage variable capacitors 23 and 24 in accordance with the voltage, thereby controlling the oscillation frequency of the oscillation circuit 20 to keep the frequency of the oscillation output signal substantially constant.

In such temperature compensation oscillators, all of the quartz crystals 15 and the oscillation circuits 20 formed in the IC chips 16 cannot be formed completely the same due to variation in manufacturing or the like, and therefore they will individually have different temperature-frequency characteristics. Accordingly, all of the oscillation circuits 20 cannot be temperature-compensated based on the same reference. Therefore, it is necessary to create individual compensation data different for each oscillation circuit and store it into the compensation data storage circuit 31. However, the oscillation circuits cannot be sufficiently compensated if the quartz crystals 15 exhibit a wide range of characteristic variation, and it is therefore necessary to adjust as much as possible the characteristics of the quartz crystals 15 in advance.

Therefore, there is an adjustment method in which the IC chip constituting the oscillation circuit is not mounted when the characteristics of the piezoelectric element such as the quartz crystal and the like are adjusted, but the piezoelectric element is caused to resonate and its resonant frequency is monitored from the outside by the network analyzer or the like and the electrode film on the surface of the piezoelectric element is removed or added so that the frequency has a desired value.

However, this adjustment method has suffered from a problem that deviation arises between the oscillation frequency when the IC chip is also mounted in the package and the circuit is caused to perform oscillation operation and the previously adjusted resonant frequency. In addition, the number of adjustment steps has been large which requires extra adjustment cost.

To solve such problems, a temperature compensation oscillator is proposed which is configured such that, in a state in which a piezoelectric element such as a quartz crystal and an IC chip are mounted in a package to constitute a temperature compensation oscillator, its oscillation circuit is operated to allow the temperature characteristic of the piezoelectric element itself to be accurately adjusted and the work to create the temperature compensation data and store it into the temperature compensation data storage circuit can also be subsequently appropriately performed, thereby simplifying and increasing the accuracy of the adjustment process (see, for example, Patent Document 1).

The temperature compensation oscillator is provided with a selection device selecting whether to bring the temperature compensated function of the temperature compensation circuit into an enabled state or a disabled state, and is caused to operate as a simple oscillator by bringing the temperature compensation function into the disabled state when adjusting the electrode film on the piezoelectric element so that the oscillation frequency is a desired frequency at a reference temperature (room temperature).

Concretely, a selection circuit using a constant voltage generation circuit and two pairs of transmission gates is provided in addition to the temperature compensation circuit, and the transmission gates of the selection circuit are switched over to apply a temperature compensation signal (voltage signal) from the temperature compensation circuit to a voltage variable capacitor of the oscillation circuit to thereby control its capacitance according to the temperature when bringing the temperature compensation function into the enabled state, and to apply a constant voltage from the constant voltage generation circuit to the voltage variable capacitor to fix the capacitance to a predetermined value when bringing the temperature compensation function into the disabled state.

Patent Document 1: JP 2003-218636A (page 4-9, FIG. 1)

DISCLOSURE OF THE INVENTION

Problems to be Solved by the Invention

However, it has been necessary to provide a dedicated constant voltage generation circuit for bringing the temperature compensation function by the temperature compensation circuit into the disabled state and a selection circuit for switching the voltage signal to be applied to the voltage variable capacitor of the oscillation circuit, in addition to the temperature compensation circuit in such a temperature compensation oscillator.

The invention has been developed to solve the problems described above, and its object is to eliminate the use of the dedicated constant voltage generation circuit for bringing the temperature compensation function by the temperature compensation circuit into the disabled state and to make it easy to switch between the disabled state and the enabled state, perform the initial frequency adjustment at room temperature with ease and accuracy, and reduce the cost.

Further, another object is to make it possible to perform adjustment of the oscillation frequency with a higher accuracy, adjustment of the power supply voltage of the oscillation circuit, change of the oscillation frequency according to application, or adjustment of the oscillation frequency by a user, and to perform initial frequency adjustment work under the same conditions at all times in such cases.

Means for Solving the Problems

A temperature compensation oscillator according to the invention comprising an oscillation circuit including a voltage variable capacitor; a temperature detection circuit detecting a temperature around the oscillation circuit; and a temperature compensation signal generation circuit generating a voltage signal as a temperature compensation signal based on information of the temperature detection circuit, the voltage signal being supplied to the voltage variable capacitor to keep an oscillation frequency substantially constant, is characterized, to achieve the above objects, in that a controller bringing both terminals of the voltage variable capacitor to a same potential is provided.

The controller can bring both terminals of the voltage variable capacitor to the same potential by applying the voltage signal being the temperature compensation signal to both the terminals of the voltage variable capacitor.

Alternatively, the controller can bring both terminals of the voltage variable capacitor to the same potential by bringing both the terminals of the voltage variable capacitor to a ground potential.

The voltage variable capacitor preferably has a characteristic to have a capacitance value substantially intermediate in a variable capacitance range in a state of both the terminals being at the same potential.

The temperature compensation oscillators may further include a memory circuit, the controller conducting a control to bring both the terminals of the voltage variable capacitor to the same potential based on information stored in the memory circuit.

The memory circuit may have a plurality of storage elements, and the controller may conduct a control to bring both the terminals of the voltage variable capacitor to the same potential when a storage state of the plurality of storage elements is a predetermined state.

The temperature compensation oscillator may further include a constant voltage circuit for keeping a driving voltage for the oscillation circuit constant, wherein the constant voltage circuit may conduct a control to bring the driving voltage to a predetermined voltage value when the storage state of the plurality of storage elements is the predetermined state.

The temperature compensation oscillators may further include a frequency division circuit for dividing a frequency of a signal oscillated by the oscillation circuit, wherein the frequency division circuit may conduct a control to divide the frequency of the signal at a predetermined frequency division ratio when the storage state of the plurality of storage elements is the predetermined state.

Further, the temperature compensation oscillators further include an external terminal for inputting a frequency control signal composed of a voltage signal to allow also the frequency control signal inputted from the external terminal or a signal made by amplifying the frequency control signal to be supplied to the voltage variable capacitor.

Alternatively, a room temperature frequency correction signal generation circuit generating a room temperature frequency correction signal being a voltage signal for correcting a deviation of the oscillation frequency at room temperature may be provided to allow also the room temperature frequency correction signal to be supplied to the voltage variable capacitor.

Further, an external terminal for inputting the frequency control signal and a room temperature frequency correction signal generation circuit generating a room temperature frequency correction signal can be provided so that the voltage signal supplied to the voltage variable capacitor is a signal made by combining the temperature compensation signal and one or both of the frequency control signal and the room temperature frequency correction signal.

A method for manufacturing a temperature compensation oscillator according to the invention is characterized in that during assembly of the temperature compensation oscillator, an adjustment work for the oscillation frequency of the oscillation circuit at room temperature is performed by adjusting the thickness of an electrode on a resonator provided in the oscillation circuit with both terminals of the voltage variable capacitor being kept at a same potential to drive the oscillation circuit.

Further, it is preferable that, during assembly of the temperature compensation oscillator including the memory circuit, writing to the memory circuit is not performed before an adjustment work for the oscillation frequency of the oscillation circuit at room temperature to keep a storage state of the plurality of storage elements in a predetermined state, to allow the oscillation frequency adjustment work to be performed by adjusting the thickness of an electrode on a resonator provided in the oscillation circuit with both terminals of the voltage variable capacitor being kept at a same potential to drive the oscillation circuit.

EFFECT OF THE INVENTION

A temperature compensation oscillator according to the invention does not need a dedicated constant voltage generation circuit for bringing the temperature compensation function into the disabled state and is possible to easily switch between the disabled state and the enabled state, perform initial adjustment work for an oscillation frequency at room temperature with ease and accuracy, and reduce the cost.

Further, it is possible to perform adjustment of the oscillation frequency with a higher accuracy, adjustment of the power supply voltage of the oscillation circuit, change of the oscillation frequency according to application, or adjustment of the oscillation frequency by a user, and to perform initial frequency adjustment work under the same conditions at all times in such cases.

Figure 1:
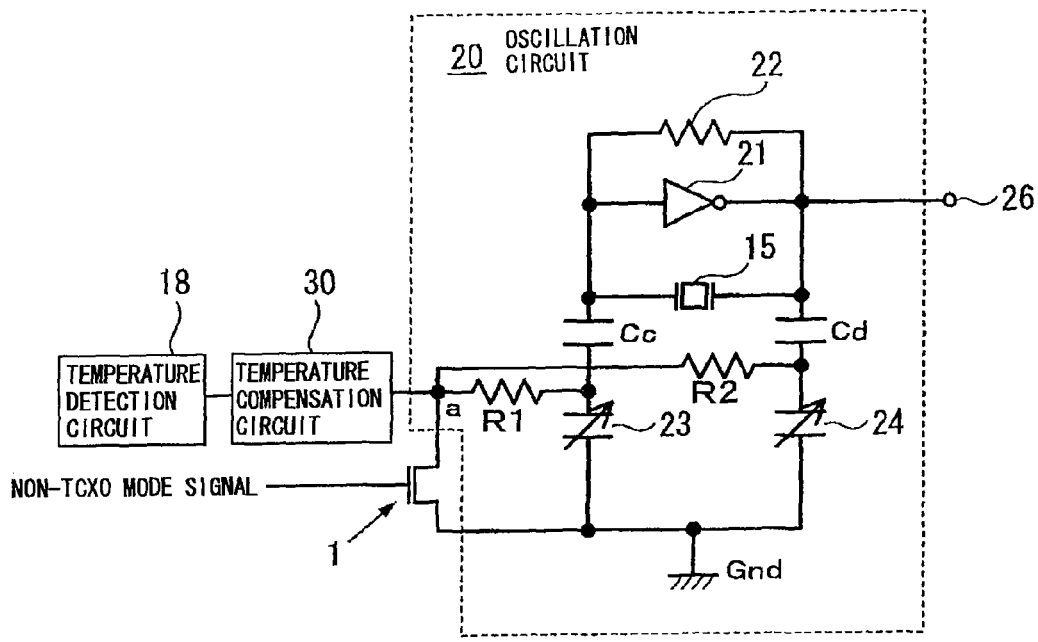
FIG. 1 is a block circuit diagram showing the configuration of a first embodiment of a temperature compensation oscillator according to the invention.

EXPLANATION OF CODES 1, 2: switch element (MOS-type transistor)
3: external terminal
4: transmission gate (bidirectional analog switch) 5: inverter
6: adding circuit 7: memory circuit 8: NAND circuit
9A, 9B: adding circuit 10: package (container)
11: package main body 12: welded ring
13: cover 15: quartz crystal (piezoelectric element)
16: MOS IC (integrated circuit) chip 18: temperature detection circuit
20, 20': oscillation circuit 21: inverter 22: feedback resistor
26: output terminal 30: temperature compensation circuit
31: compensation data storage circuit 32: D/A conversion circuit
41: P-type silicon substrate 42: N-well 43: N-type rich layer
44: bulk 45: insulating film ($SiO_2$) 46: metal film
47: P-type rich layer
50: room temperature frequency correction signal generation circuit
60: constant voltage circuit 61: power supply line
62: ground line 63: reference voltage generating section
64: amplifying section 65: output FET 66: feedback resistor
67: memory circuit 70: output amplifying circuit
80: frequency division circuit 81: memory circuit
Cc, Cd, Ce: DC cut capacitor (condenser)
R1, R2, R3: resistor S1 to S4: switch element

BEST MODE FOR CARRYING OUT THE INVENTION

Hereinafter, best modes for embodying the invention will be described. Note that, in the following drawings, the same numerals are given to portions corresponding to the above-described respective portions in FIG. 15, and description thereof will be simplified.

First Embodiment: FIG. 1

FIG. 1 is a block circuit diagram showing the configuration of the first embodiment of a temperature compensation oscillator according to the invention.

Figure 15:
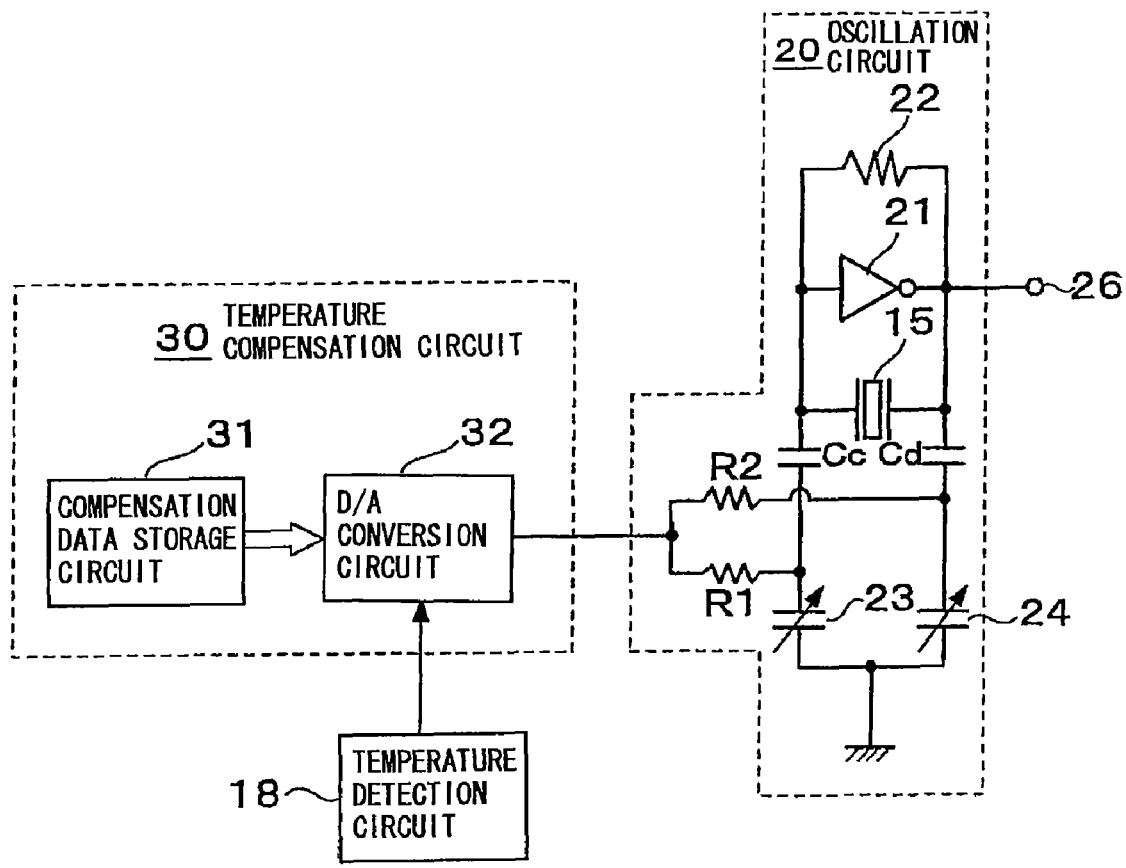
FIG. 15 is a block circuit diagram showing a configuration example of a temperature compensation oscillator in the prior art.

The temperature compensation oscillator shown in FIG. 1 includes, as in the prior art shown in FIG. 15, an oscillation circuit 20 constituted by connecting a quartz crystal 15, an inverter 21, and a feedback resistor 22 in parallel and connecting their both connection points to the ground (Gnd) via DC cut capacitors (condensers) Cc and Cd and voltage variable capacitors 23 and 24 which are oscillation capacitors respectively; a temperature detection circuit 18 which detects the temperature state near the quartz crystal 15 by a thermistor or the like; and a temperature compensation circuit 30 which controls the oscillation frequency of the oscillation circuit 20 substantially constant based on a temperature detection signal from the temperature detection circuit 18.

The temperature compensation circuit 30 has, as in the prior art shown in FIG. 15, a compensation data storage circuit (non-volatile memory) and a D/A conversion circuit which generates a temperature compensation signal (voltage signal) based on the compensation data and the temperature detection signal from the temperature detection circuit 18. Then, the voltage signal is applied from a frequency control signal input point a of the oscillation circuit 20 to terminals on the non-grounded side of the voltage variable capacitors 23 and 24 via resistors R1 and R2 respectively, so as to change the capacitance value of each of the variable capacitors 23 and 24 in accordance with the voltage, thereby controlling the oscillation frequency of the oscillation circuit 20 to keep the frequency of an oscillation output signal to be outputted to an output terminal 26 substantially constant.

In the temperature compensation oscillator according to the invention, a controller is provided for bringing both terminals of each of the voltage variable capacitors 23 and 24 to the same potential. In the first embodiment shown in FIG. 1, a switch element 1 composed of an MOS-type transistor is provided as the controller such that its source terminal and drain terminal are connected to the frequency control signal input point a and the ground (Gnd), respectively and a non-TCXO mode signal (a signal to disable a temperature compensation function by the temperature compensation circuit 30) is inputted to its gate terminal.

When the non-TCXO mode signal is at high level, the switch element 1 is brought into a conduction state (ON) to ground the frequency control signal input point a, whereby both terminals of each of the voltage variable capacitors 23 and 24 are brought to the same potential as the ground potential. This allows both the variable capacitors 23 and 24 to have a predetermined capacitance value without variation, and the oscillation circuit 20 oscillates at a frequency close to its prescribed value using them as oscillation capacitors, but the oscillation frequency slightly varies due to its ambient temperature. This state is referred to as a non-TCXO mode.

While the oscillation circuit 20 is operating in the non-TCXO mode at normal temperature (generally, room temperature: 25° C.), its temperature characteristic can be accurately adjusted to provide the prescribed oscillation frequency by adjusting the thickness of the electrode film on the quartz crystal 15, and thereafter the work to stepwise change the ambient temperature and create compensation data and store it into a compensation data storage circuit of the temperature compensation circuit 30 can also be easily continuously performed. This frequency adjustment work will be described later in detail.

When the non-TCXO mode signal is turned to low level, the switch element 1 is brought to a non-conduction state (OFF), so that the frequency control signal input point a is no longer grounded, the temperature compensation signal (voltage signal) from the temperature compensation circuit 30 is applied to each of the voltage variable capacitors 23 and 24 via the resistors R1 and R2 respectively as described above to control the oscillation frequency of the oscillation circuit 20 substantially constant even if the ambient temperature changes. This state is referred to as a TCXO mode.

The non-TCXO mode signal may be inputted from the outside or may be generated (brought to high level) when the storage state of a later-described memory circuit provided inside is in a predetermined state.

Note that in the case where the switch element 1 is of a type turned on when its gate terminal is at low level, the non-TCXO mode is established when the non-TCXO mode signal is at low level, and the TCXO mode is established when the non-TCXO mode signal is at high level.

Also in the embodiments below, in the case where a switch element or a transmission gate is of a type turned on when it is at low level "0", the non-TCXO mode is established when the non-TCXO mode signal is at low level "0", and the TCXO mode is established when the non-TCXO mode signal is at high level "1."

Figure 2:
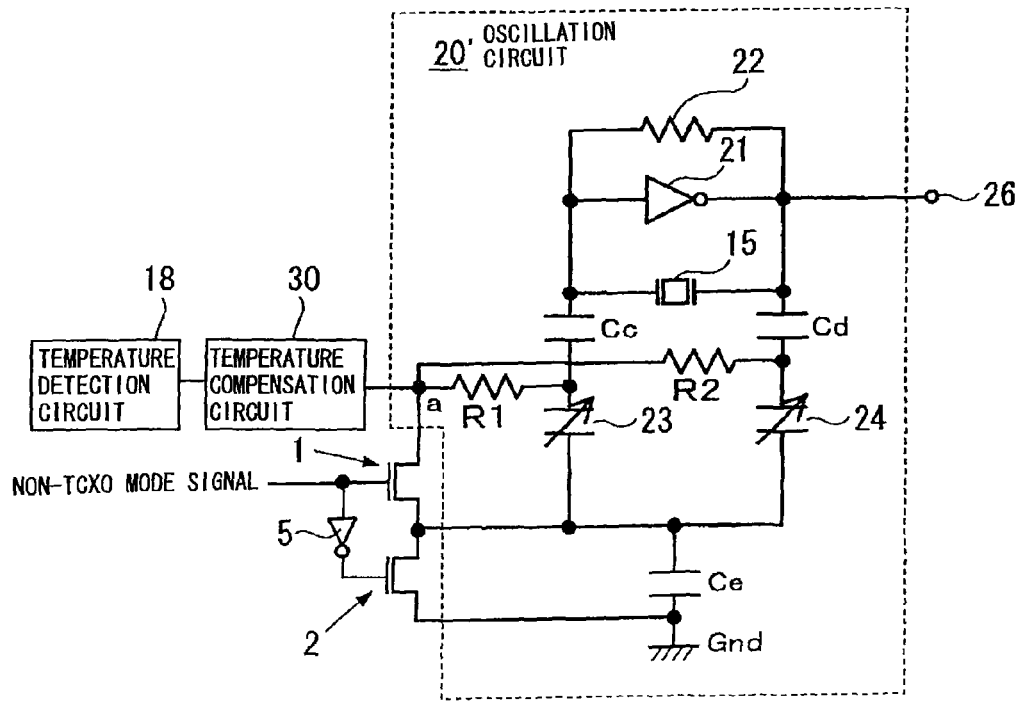
FIG. 2 is a block circuit diagram showing the configuration of a second embodiment of the temperature compensation oscillator according to the invention.

Second Embodiment: FIG. 2

FIG. 2 is a block circuit diagram showing the configuration of the second embodiment of the temperature compensation oscillator according to the invention.

The temperature compensation oscillator of the second embodiment has a configuration of an oscillation circuit 20', slightly different from that of the oscillation circuit 20 of the first embodiment, in which a common connection terminal of the voltage variable capacitors 23 and 24 is grounded via a DC cut capacitance (capacitor) Ce. In addition, the source terminal and the drain terminal of a switch element 2 similar to the first switch element 1 are connected to both terminals of the DC cut capacitor Ce, and a signal made by inverting the non-TCXO mode signal through an inverter 5 is applied to the gate terminal of the switch element 2.

In the second embodiment, when the non-TCXO mode signal is at high level, the switch element 1 is brought to a conduction state (ON) and the switch element 2 is brought to a non-conduction state (OFF) so that a voltage signal that is the temperature compensation signal is applied to both terminals of each of the voltage variable capacitors 23 and 24 to bring both the terminals to the same potential. This allows both the variable capacitors 23 and 24 to have a predetermined capacitance value, and the oscillation circuit 20' is brought into the non-TCXO mode to oscillate at a frequency close to its prescribed value using them as oscillation capacitors.

When the non-TCXO mode signal is turned to low level, the switch element 1 is brought to a non-conduction state (OFF) and the switch element 2 is brought to a conductive state (ON), that is the same state as that when the non-TCXO mode signal is turned to low level in the first embodiment, whereby the TCXO mode is established in which a voltage signal that is the temperature compensation signal from the temperature compensation circuit 30 is applied to each of the voltage variable capacitors 23 and 24 via the resistors R1 and R2 respectively to control the oscillation frequency of the oscillation circuit 20' substantially constant even if the ambient temperature changes.

Accordingly, the switch elements 1 and 2 and the inverter 5 which are controlled by the non-TCXO mode signal constitute a controller which brings both the terminals of each of the voltage variable capacitors 23 and 24 to the same potential in the second embodiment.

Figure 3:
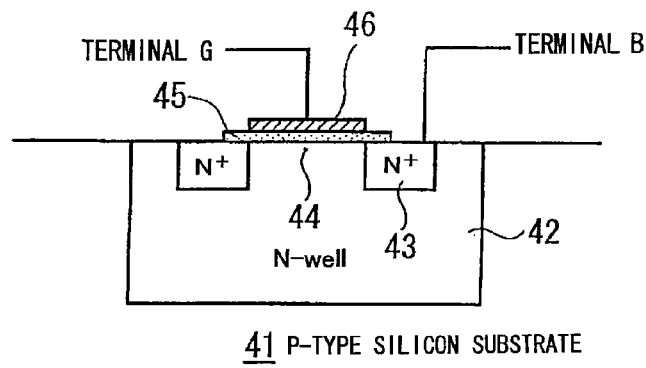
FIG. 3 is a schematic sectional view showing a configuration example of a MOS-type variable capacitor that is one example of a voltage variable capacitor for use in the invention.
Figure 4:
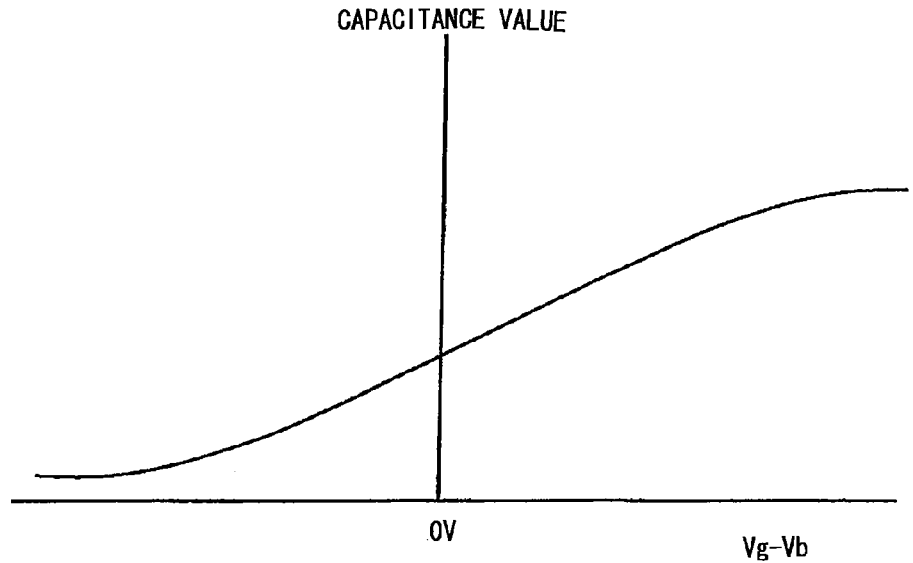
FIG. 4 is a characteristic curve graph showing the relation between the application voltage and the capacitance value of the MOS-type variable capacitor.
Figure 5:
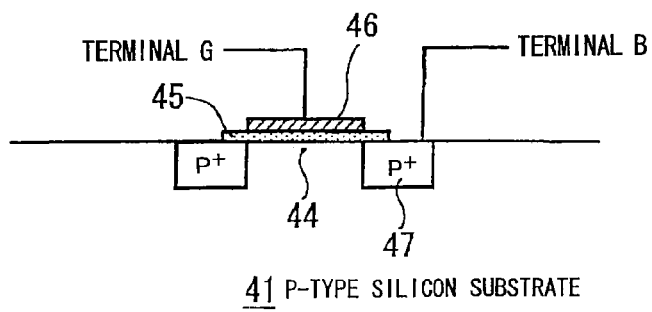
FIG. 5 is a schematic sectional view showing another configuration example of the MOS-type variable capacitor.

Concrete Example of Voltage Variable Capacitor: FIG. 3 to FIG. 5

A concrete example of the voltage variable capacitors 23 and 24 for use in the invention will be described here.

FIG. 3 is a schematic sectional view showing a configuration example of a MOS-type variable capacitor that is one example of the voltage variable capacitor.

In the MOS-type variable capacitor, an N-well 42 is formed in a P-type silicon substrate 41, and an N-type rich layer 43 is formed in an annular shape near the surface of the substrate 41. Further, an insulating film 45 made of $SiO_2$ in a circular shape or a square shape is formed to overlap the inner periphery of the N-type rich layer 43, on which a metal film (aluminum or the like) 46 in a circular shape or a square shape is formed, and a terminal G (gate terminal) is connected thereto. Further, a terminal B (bulk terminal) is connected to the N-type rich layer 43. In addition, a bulk 44 and the metal film 46 holding the insulating film 45 therebetween form a capacitor (condenser), and its capacitance value changes according to a voltage Vg−Vb applied between the terminal G and the terminal B.

FIG. 4 is a characteristic curve graph showing the relation between the application voltage (Vg−Vb) and the capacitance value of the MOS-type variable capacitor. Many MOS-type variable capacitors have a capacitance value substantially at the intermediate (midpoint) value of a variable width when the application voltage (Vg−Vb) between the terminal G and the terminal B is 0 V, that is, when terminal G and terminal B thereof are at the same potential, as shown by the characteristic curve graph. Use of the MOS-type variable capacitor having such a characteristic as the voltage variable capacitors 23 and 24 in the above-described embodiments enables a uniform and wide adjustable range of increase/decrease in capacitance value, thereby allowing the frequency adjustment by the non-TCXO mode at room temperature to be performed at the oscillation state with the intermediate capacitance value to facilitate control by the temperature compensation signal in the TCXO mode thereafter.

Further, the terminal G and the terminal B are insulated by the insulating film 45 and the N-well 42 from the P-type substrate 41 which is grounded, so that an arbitrary voltage signal can be applied to each of the terminals, and therefore this MOS-type variable capacitor is suitable for use as the voltage variable capacitors 23 and 24 in the above-described second embodiment and later-described third to sixth embodiments.

FIG. 5 is a schematic sectional view showing another configuration example of the MOS-type variable capacitor. This MOS-type variable capacitor is made by omitting the N-well 42 in the MOS-type variable capacitor shown in FIG. 3, directly forming a P-type rich layer 47 in an annular shape near the surface of the P-type substrate 41 in place of the N-type rich layer 43, and connecting the terminal B to the P-type rich layer 47.

However, since the terminal B is grounded together with the P-type substrate 41, this MOS-type variable capacitor is suitable for use as the voltage variable capacitors 23 and 24 in the above-described first embodiment and a later-described seventh embodiment.

Note that the voltage variable capacitor in the oscillation circuit of the temperature compensation oscillator according to the invention is not limited to such an MOS-type variable capacitor, and a variable capacitance diode can also be used.

Figure 6:
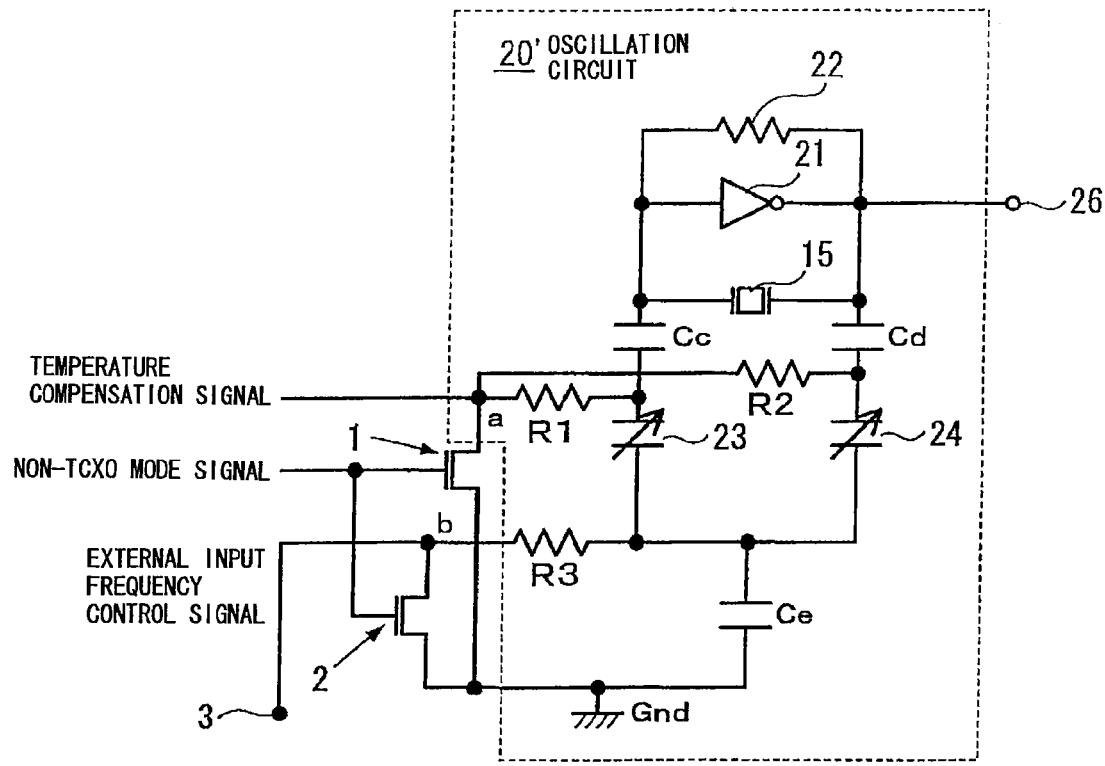
FIG. 6 is a circuit diagram showing the configuration of a third embodiment of the temperature compensation oscillator according to the invention.

Third Embodiment: FIG. 6

FIG. 6 is a circuit diagram showing a configuration of a third embodiment of the temperature compensation oscillator according to the invention.

In the temperature compensation oscillator of the third embodiment, the switch element 1 in the second embodiment shown in FIG. 2 is connected between the frequency control signal input point a of the oscillation circuit 20' and the ground (Gnd), the second switch element 2 is connected between another frequency control signal input point b via a resistor R3 from the common connection terminal of the voltage variable terminals 23 and 24 and the ground, and the non-TCXO mode signal is directly applied also to the gate terminal of the second switch element 2. In addition, an external input frequency control signal (voltage signal) is applied from an external terminal 3 to the frequency control signal input point b. If the external input frequency control signal is small, the signal may be inputted into the frequency control signal input point b after amplified by a not-shown amplifying circuit.

In this temperature compensation oscillator, when the non-TCXO mode signal is at high level, both the first and second switch elements 1 and 2 are brought to a conduction state (ON) to bring both the frequency control signal input points a and b to the ground potential, whereby both terminals of each of the voltage variable capacitors 23 and 24 are brought to the same potential at the ground potential to cause the oscillation circuit 20' to oscillate in the same state as that of the oscillation circuit 20 in the first embodiment in the non-TCXO mode.

When the non-TCXO mode signal is turned to low level, both the switch elements 1 and 2 are brought to a non-conduction state (OFF), so that the temperature compensation signal is applied to the frequency control signal input point a and the external input frequency control signal is applied to the frequency control signal input point b, whereby a differential voltage therebetween is applied between both terminals of each of the voltage variable capacitors 23 and 24. Therefore, the voltage variable capacitors 23 and 24 have capacitance values according to the differential voltage, so that the oscillation frequency of the oscillation circuit 20' is controlled by the temperature compensation signal and the external input frequency control signal.

The external input frequency control signal is inputted from the external part by a user and can arbitrarily shift the prescribed value of the oscillation frequency of the oscillation circuit 20'. By keeping the voltage when the compensation value of the temperature compensation signal is zero and the voltage of the external input frequency control signal during non-control, at the potential intermediate (midpoint) between the power supply voltage Vdd of the oscillation circuit 20' and the ground potential, the control range by both the signals can be wide, whereby both terminals of each of the voltage variable capacitors 23 and 24 are brought to the same potential when both the signals are at the same potential to produce the same state as that in the non-TCXO mode.

It is also possible to detect the actual oscillation frequency of the oscillation circuit 20' and feedback-control the external input frequency control signal according to the error with respect to a desired frequency.

Figure 7:
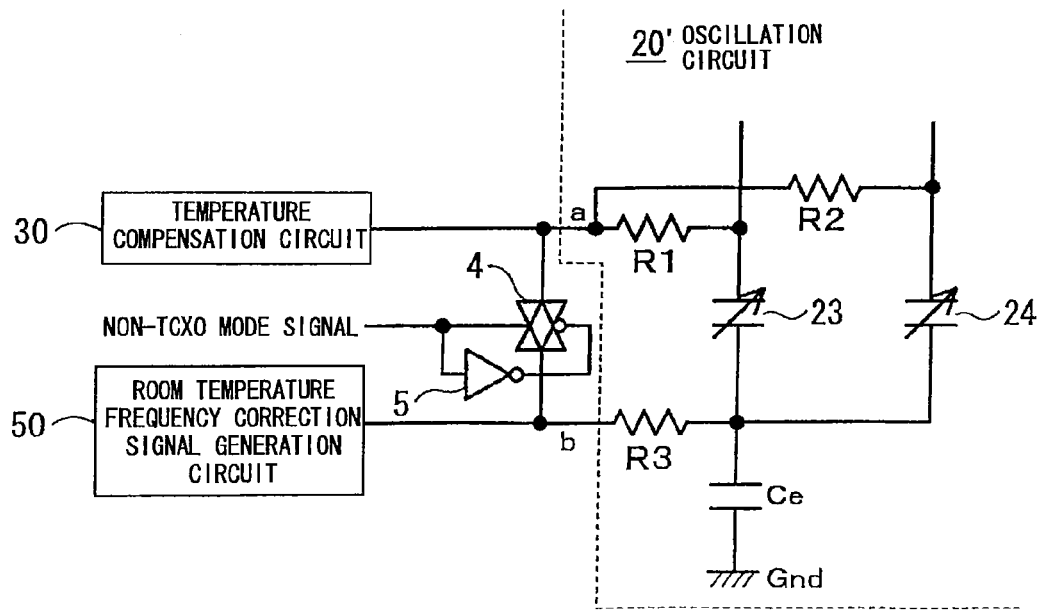
FIG. 7 is a block circuit diagram showing the configuration of a principal part of a fourth embodiment of the temperature compensation oscillator according to the invention.

Fourth Embodiment: FIG. 7

FIG. 7 is a block circuit diagram showing a configuration of a principal part of the fourth embodiment of the temperature compensation oscillator according to the invention.

In the temperature compensation oscillator of the fourth embodiment, a transmission gate 4 that is a bidirectional analog switch is connected between the two frequency control signal input points a and b of the same oscillation circuit 20' as that of the above-described third embodiment, and the non-TCXO mode signal is applied as it is to its positive logic gate terminal and a signal made by inverting the non-TCXO mode signal by the inverter 5 is applied to its negative logic gate. Further, the temperature compensation signal outputted from the temperature compensation circuit 30 is inputted into the frequency control signal input point a, and a room temperature frequency correction signal (voltage signal) generated by a room temperature frequency correction signal generation circuit 50 is inputted into the frequency control signal input point b.

In this temperature compensation oscillator, when the non-TCXO mode signal is at high level, the transmission gate 4 is brought into a conduction state (ON) to short-circuit the frequency control signal input points a and b, whereby the temperature compensation signal and the room temperature frequency correction signal are brought to the same potential, and both terminals of each of the voltage variable capacitors 23 and 24 are also brought to the same potential. Accordingly, the oscillation circuit 20' oscillates in the same state as that in the non-TCXO mode in the second embodiment shown in FIG. 2.

When the non-TCXO mode signal is turned to low level, the transmission gate 4 is brought to a non-conduction state (OFF), so that the temperature compensation signal is applied to the frequency control signal input point a and the room temperature frequency correction signal is applied to the frequency control signal input point b, whereby a differential voltage therebetween is applied between both terminals of each of the voltage variable capacitors 23 and 24. Therefore, the voltage variable capacitors 23 and 24 have capacitance values according to the differential voltage, so that the oscillation frequency of the oscillation circuit 20' is controlled by the temperature compensation signal and the room temperature frequency correction signal.

In the case where the oscillation frequency of the oscillation circuit 20' needs to be highly accurately adjusted to exactly match a nominal value (13 MHz, 19.2 MHz, or the like), only adjustment of the thickness of the electrode film on the quartz crystal 15 cannot meet the need, and therefore the room temperature frequency correction signal is used to further correct a deviation with respect to the nominal value at room temperature after the above-described initial adjustment. Also in this case, by keeping the voltage when the compensation value of the temperature compensation signal is zero and the voltage of the room temperature frequency correction signal during non-correction, at the potential intermediate (midpoint) between the power supply voltage Vdd of the oscillation circuit 20' and the ground potential, the correction range by both the signals can be wide, whereby both terminals of each of the voltage variable capacitors 23 and 24 are brought to the same potential when both the signals are at the same potential to produce the same state as that in the non-TCXO mode.

Figure 8:
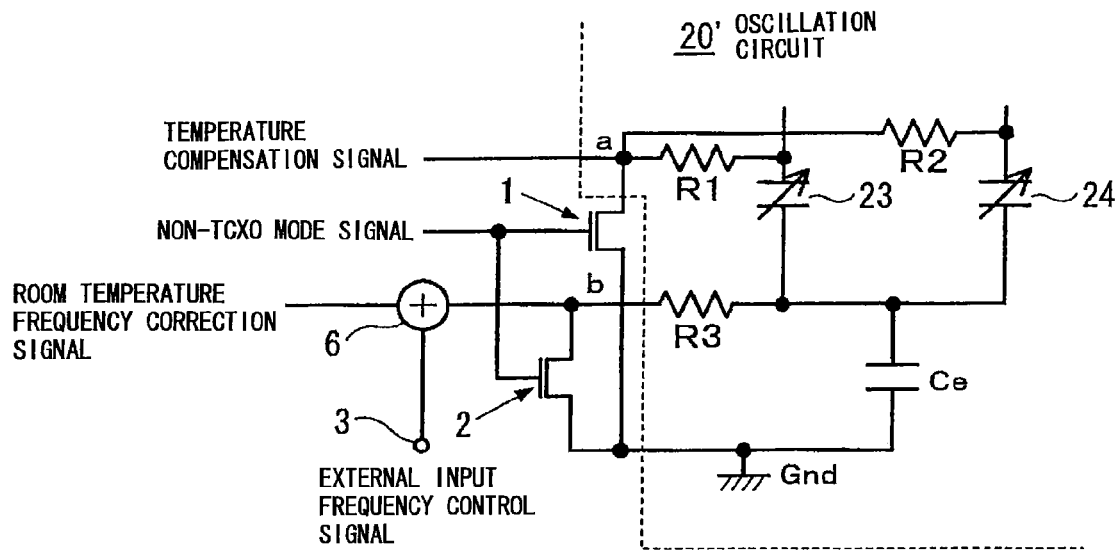
FIG. 8 is a circuit diagram showing the configuration of a principal part of a fifth embodiment of the temperature compensation oscillator according to the invention.

Fifth Embodiment: FIG. 8

FIG. 8 is a circuit diagram showing a configuration of a principal part of the fifth embodiment of the temperature compensation oscillator according to the invention.

In the temperature compensation oscillator of the fifth embodiment, having almost the same configuration as that of the above-described third embodiment (FIG. 6), a signal combining the external input frequency control signal (a signal made by amplifying the external input frequency control signal may be used) inputted from the external terminal 3 and the room temperature frequency correction signal generated by the room temperature frequency correction signal generation circuit 50 by an adding circuit 6 is inputted into the frequency control signal input point b.

The operation of the temperature compensation oscillator when the non-TCXO mode signal is at high level is the same as the operation in the non-TCXO mode in the third embodiment.

When the non-TCXO mode signal is turned to low level, both the switch elements 1 and 2 are brought to a non-conduction state (OFF), so that the temperature compensation signal is applied to the frequency control signal input point a and the combined signal composed of the external input frequency control signal and the room temperature frequency correction signal is applied to the frequency control signal input point b, whereby a differential voltage therebetween is applied between both terminals of each of the voltage variable capacitors 23 and 24. Therefore, the voltage variable capacitors 23 and 24 have capacitance values according to the differential voltage, so that the oscillation frequency of the oscillation circuit 20' is controlled by the temperature compensation signal, the external input frequency control signal and the room temperature frequency correction signal.

According to this embodiment, it is possible to perform correction of the deviation of the prescribed frequency at room temperature by the room temperature frequency correction signal and shift of the oscillation frequency during use by the temperature compensation and the room temperature frequency correction signals.

Figure 9:
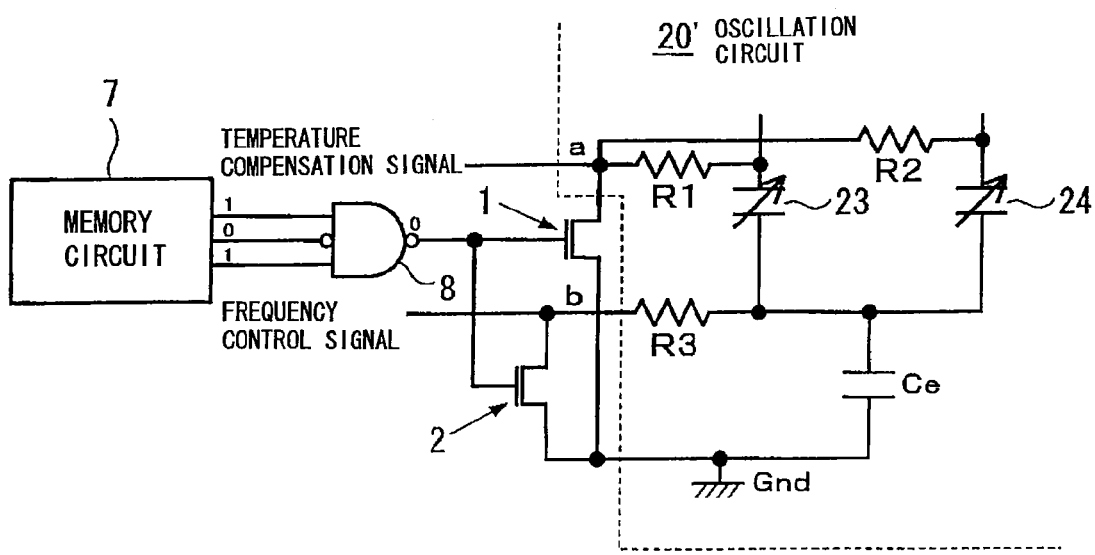
FIG. 9 is a block circuit diagram showing the configuration of a principal part of a sixth embodiment of the temperature compensation oscillator according to the invention.

Sixth Embodiment: FIG. 9

FIG. 9 is a block circuit diagram showing a configuration of a principal part of the sixth embodiment of the temperature compensation oscillator according to the invention.

In the temperature compensation oscillator of the sixth embodiment, having almost the same configuration as that of the above-described fifth embodiment (FIG. 8), a frequency control signal is inputted to the frequency control signal input point b. This frequency control signal may be any one of the above-described external input frequency control signal or room temperature frequency correction signal, another voltage signal for controlling the frequency, or a signal combining those two or more signals.

Further, a memory circuit 7 and a NAND circuit 8 having three inputs (the middle input terminal is of a negative logic) are provided for generating the non-TCXO mode signal to apply the output of the NAND circuit 8 as the non-TCXO mode signal to the gates of the switch elements 1 and 2.

The memory circuit 7 has a plurality of (three in this example) storage elements in which when the storage state is in a state other than "101," the output of the NAND circuit 8 is "1" to bring both the switch elements 1 and 2 into a conduction state (ON).

Therefore, both the frequency control signal input points a and b are grounded to be at the same potential, whereby both terminals of each of the variable capacitors 23 and 24 of the oscillation circuit 20' are also brought to the same potential. Accordingly, the oscillation circuit 20' oscillates in the same state as that in the non-TCXO mode in the fifth embodiment shown in FIG. 8.

In the initial state in which nothing is written in the memory circuit 7, the plurality of storage elements are normally in the state of all "0" or all "1," and assuming that such a storage state is a "predetermined state," a control to bring both terminals of each of the voltage variable capacitors 23 and 24 to the same potential is conducted when the storage state of the plurality of storage elements in the memory circuit 7 is in the "predetermined state."

When the storage state of the plurality of storage elements in the memory circuit 7 is turned to "101," the output of the NAND circuit 8 becomes "0" to bring both the switch elements 1 and 2 into a non-conduction state (OFF) so that the temperature compensation signal is applied to the frequency control signal input point a and the above-described frequency control signal is applied to the frequency control signal input point b, whereby a differential voltage therebetween is applied between both terminals of each of the voltage variable capacitors 23 and 24. Therefore, the voltage variable capacitors 23 and 24 have capacitance values according to the differential voltage, so that the oscillation frequency of the oscillation circuit 20' is controlled by the temperature compensation signal and the above-described frequency control signal.

The memory circuit 7 and the three-input NAND circuit 8 in this embodiment can also be applied to generate the non-TCXO mode signal in each of the embodiments which have been described thus far.

Further, replacement of the NAND circuit 8 with an AND circuit having three inputs (the middle input terminal is of a negative logic) makes it possible to conduct a control such that the output of the AND circuit, that is, the non-TCXO mode signal is turned to "1" only when the storage state of the plurality of storage elements in the memory circuit 7 is "101" to bring both the first and second switch elements 1 and 2 to a conduction state (ON), whereby both terminals of each of the voltage variable capacitors 23 and 24 are brought to the same potential. In this case, the storage state of the plurality of storage elements in the memory circuit 7 being "101" is the "predetermined state."

This "predetermined state" is not limited to these examples, but can be set to any combination of "1" and "0" in any number of bits.

Figure 10:
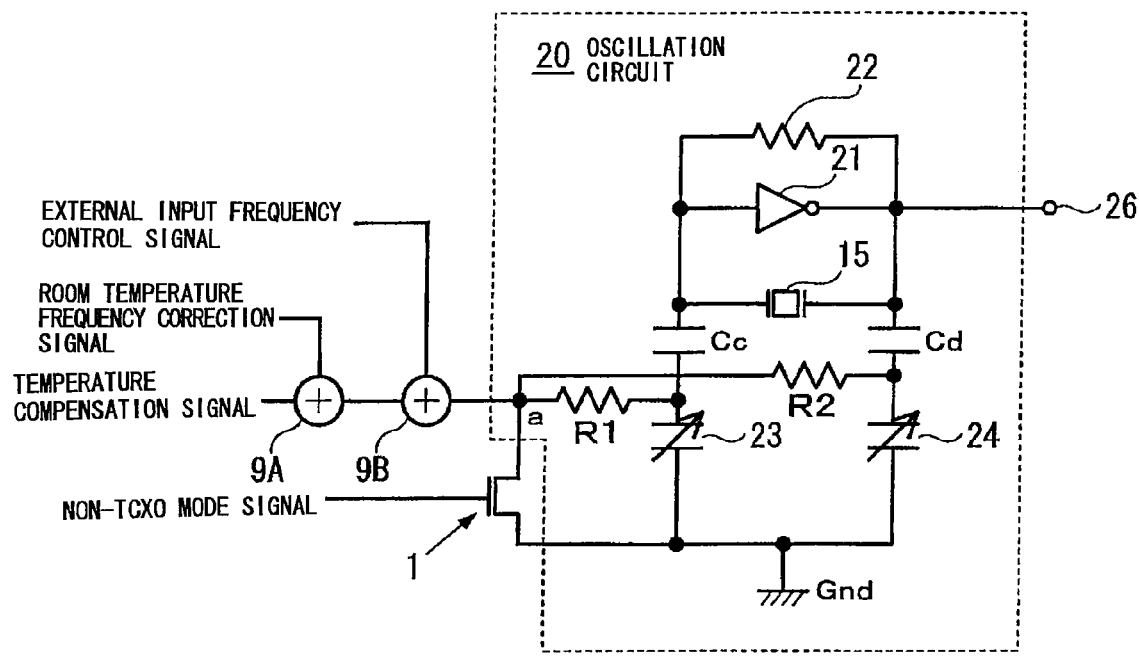
FIG. 10 is a circuit diagram showing the configuration of a principal part of a seventh embodiment of the temperature compensation oscillator according to the invention.

Seventh Embodiment: FIG. 10

FIG. 10 is a circuit diagram showing a configuration of a principal part of the seventh embodiment of the temperature compensation oscillator according to the invention.

In the temperature compensation oscillator of the seventh embodiment, having almost the same configuration as that of the above-described first embodiment (FIG. 1), a voltage signal made by combining the temperature compensation signal, the room temperature frequency correction signal and the external input frequency control signal by adding circuits 9A and 9B is inputted to the frequency control signal input point a. This allows any of the temperature compensation signal, the room temperature frequency correction signal and the external input frequency control signal to control the oscillation frequency of the oscillation circuit 20 in the TCXO mode in which the non-TCXO mode signal is at low level.

Note that the input to the frequency control signal input point a may be a voltage signal made by combining the temperature compensation signal and any one of the room temperature frequency correction signal and the external input frequency control signal.

Figure 11:
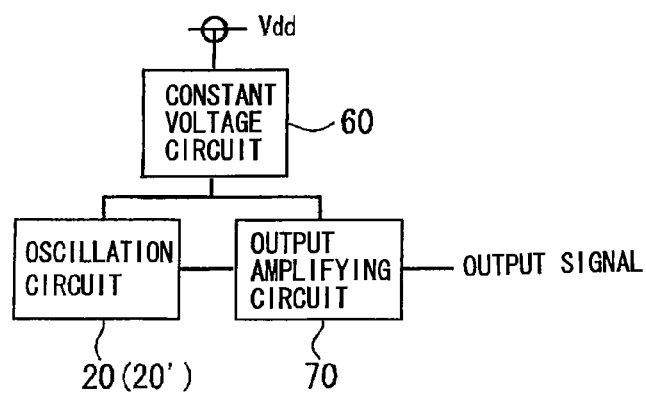
FIG. 11 is a block diagram showing the configuration of an eighth embodiment of the temperature compensation oscillator according to the invention.
Figure 12:
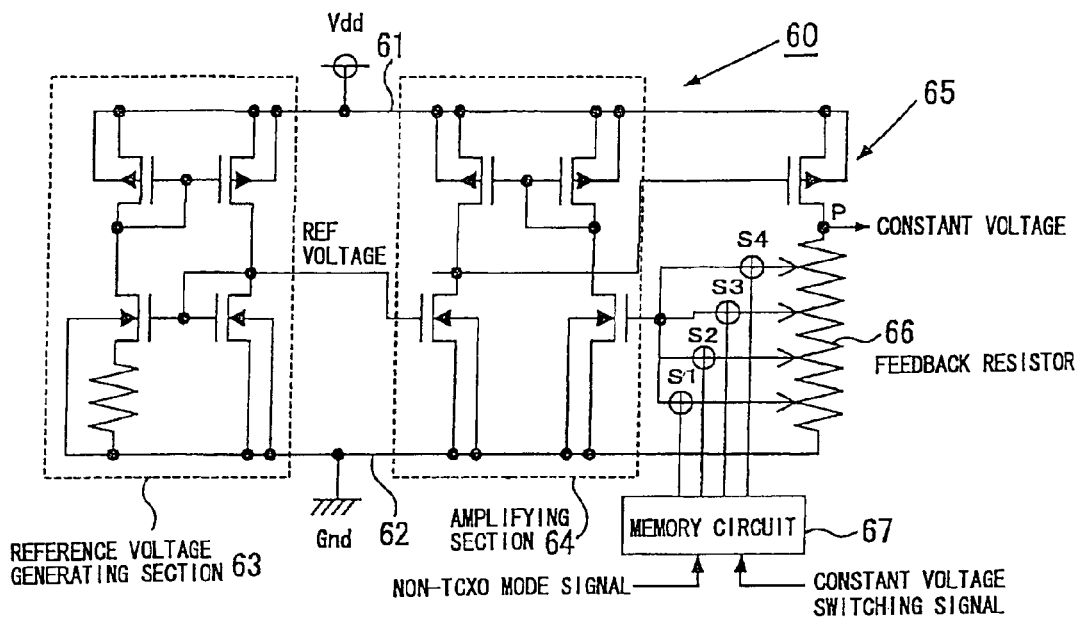
FIG. 12 is a circuit diagram showing a configuration example of a constant voltage circuit in FIG. 11.

Eighth Embodiment: FIG. 11 and FIG. 12

FIG. 11 is a block diagram showing a configuration of the eighth embodiment of the temperature compensation oscillator according to the invention. This temperature compensation oscillator includes the oscillation circuit 20 (or 20', hereinafter referred to as 20 as a representative), a constant voltage circuit 60 and an output amplifying circuit 70. The output amplifying circuit 70 is a circuit which amplifies the oscillation output signal of the oscillation circuit 20 and outputs the resulting signal, and the constant voltage circuit 60 is a circuit for keeping the driving voltages of the oscillation circuit 20 and the output amplifying circuit 70 constant.

Note that though the illustration of the internal circuits of the oscillation circuit 20 and the input points for the temperature compensation signal and other frequency control signals, the controller for bringing both terminals of the voltage control capacitors to the same potential by the non-TCXO mode signal and so on is omitted in FIG. 11, any of those in the above-described embodiments may be used for them.

The constant voltage circuit 60 is configured, for example, as shown in FIG. 12, in which a reference voltage generating section 63 composed of four FETs and one resistor, an amplifying section 64 composed of four FETs and a series circuit composed of an output FET 65 and a feedback resistor 66, are connected between a power supply line 61 to which the power supply voltage Vdd is applied and a grounded ground line 62.

The feedback resistor 66 is provided with taps at four locations and connected from each tap to the gate of a feedback FET in the amplifying section 64 via any one of switch elements S1 to S4. The switch elements S1 to S4 are ON/OFF-controlled by the state ("0" or "1") of each bit of the four-bit output of a memory circuit 67.

The reference voltage generating section 63 generates a reference voltage between the power supply voltage Vdd and the ground voltage, the amplifying section 64 feedback-amplifies the voltage, so that a constant voltage is outputted from the connection point between the output FET 65 and the feedback resistor 66 and supplied to the oscillation circuit 20 and the output amplifying circuit 70.

Into the memory circuit 67, a constant voltage switching signal and the above-described non-TCXO mode signal are inputted so that when the non-TCXO mode signal is "0," a plurality of storage data in the memory circuit 67 can be selected or the storage data can be rewritten by the constant voltage switching signal. This can selectively bring any one of the switch elements S1 to S4 to the ON state based on the output data of the memory circuit 67 to thereby control the feedback voltage at four steps so as to switch the constant voltage to be outputted in four levels.

When the non-TCXO mode signal is "1," predetermined storage data of the plurality of storage data in the memory circuit 67 is selected or the storage data is rewritten to the predetermined storage data. This can selectively bring only a predetermined switch element out of the switch elements S1 to S4 to the ON state based on the output data of the memory circuit 67 to thereby bring the feedback voltage to a predetermined step so as to control the constant voltage to be outputted to a predetermined voltage value.

In the case where the non-TCXO mode signal is generated by the memory circuit 7 and the NAND circuit 8 shown in FIG. 9, when the storage state of the plurality of storage elements in the memory circuit 7 is in the predetermined state, the non-TCXO mode signal is turned to "1" to control the constant voltage outputted by the constant voltage circuit 60, that is, the driving voltage for the oscillation circuit 20 to a predetermined voltage value.

According to this embodiment, a plurality of constant voltages can be selected to drive the oscillation circuit 20 and the output amplifying circuit 70, so that in the non-TCXO mode in which the oscillation frequency of the oscillation circuit 20 is initially adjusted at room temperature, the oscillation circuit 20 and the output amplifying circuit 70 can be operated by a predetermined driving voltage at all times to perform the initial adjustment under the same driving conditions at all times.

This predetermined driving voltage is preferably a constant voltage of a voltage as close as to the middle value out of a plurality of constant voltages being different voltages which the constant voltage circuit 60 can output.

Figure 13:
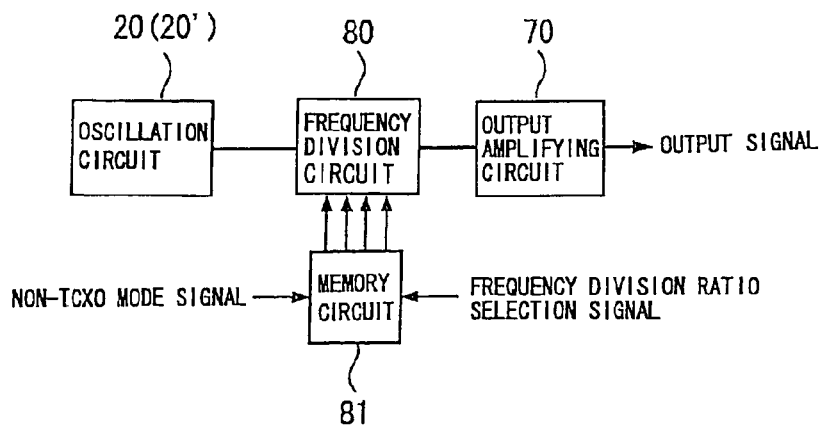
FIG. 13 is a block diagram showing the configuration of a ninth embodiment of the temperature compensation oscillator according to the invention.

Ninth Embodiment: FIG. 13

FIG. 13 is a block diagram showing a configuration of the ninth embodiment of the temperature compensation oscillator according to the invention. This temperature compensation oscillator includes the oscillation circuit 20 (or 20', hereinafter referred to as 20 as a representative), a frequency division circuit 80, a memory circuit 81 and the output amplifying circuit 70.

Then, the oscillation output signal by the oscillation circuit 20 is divided in frequency by the frequency division circuit 80 as necessary, and the resulting signal is amplified and output by the output amplifying circuit 70.

Note that though the illustration of the internal circuits of the oscillation circuit 20 and the input points for the temperature compensation signal and other frequency control signals, the controller for bringing both terminals of the voltage control capacitors to the same potential by the non-TCXO mode signal and so on is omitted also in FIG. 13, any of those in the above-described embodiments may be used for them. Further, a constant voltage circuit 60 similar to that in the above-described eighth embodiment may be provided.

The frequency division circuit 80 is a publicly known variable frequency division circuit and controlled to have a predetermined frequency division ratio (for example 1.00 or 0.50) based on the data of a plurality of bits (four bits in this example) outputted from the memory circuit 81. Into the memory circuit 81, a frequency division ratio selection signal and the above-described non-TCXO mode signal are inputted so that when the non-TCXO mode signal is "0," a plurality of storage data in the memory circuit 81 can be selected or the storage data can be rewritten by the frequency division ratio selection signal. This allows the frequency division ratio of the frequency division circuit 80 to be any one of a plurality of different frequency division ratios based on the output data of the memory circuit 81.

When the non-TCXO mode signal is "1," predetermined storage data of the plurality of storage data in the memory circuit 81 can be selected or the storage data can be rewritten to the predetermined storage data. This controls the frequency division ratio of the frequency division circuit 80 to a predetermined frequency division ratio based on the output data of the memory circuit 81.

In the case where the non-TCXO mode signal is generated by the memory circuit 7 and the NAND circuit 8 shown in FIG. 9, when the storage state of the plurality of storage elements in the memory circuit 7 is in the predetermined state, the non-TCXO mode signal is turned to "1" to control the frequency division circuit 80 to have a predetermined frequency division ratio.

According to this embodiment, the oscillation output signal outputted from the oscillation circuit 20 can be divided in frequency at a desired frequency division ratio by the frequency division circuit 80, and the resulting signal can be amplified and outputted by the output amplifying circuit 70. However, in the case of the non-TCXO mode in which the oscillation frequency of the oscillation circuit 20 is initially adjusted at room temperature, the frequency division circuit 80 can be operated at a predetermined frequency division ratio at all times to perform the initial adjustment under the same driving conditions at all times.

This predetermined frequency division ratio is set to, for example, 1 (without division).

Embodiment of Method for Manufacturing Temperature Compensation Oscillator

In the temperature compensation oscillator in each of the above-described embodiments according to the invention, the initial adjustment of the quartz crystal that is a resonator of the oscillation circuit 20 (or 20', hereinafter referred to as 20 as a representative) during its assembly process and the adjustment work to create and store temperature compensation data can be performed by operating the oscillation circuit 20 with the quartz crystal 15 and an IC chip constituting the oscillation circuit 20 and the temperature compensation circuit 30 or the like being mounted in a package to complete the temperature compensation oscillator.

During the initial adjustment, the non-TCXO mode signal is kept at high level "1." When the non-TCXO mode signal is generated by the memory circuit 7 and the NAND circuit 8 shown in FIG. 9, the storage state of the plurality of storage elements in the memory circuit 7 is brought to a predetermined state other than "101" to bring both terminals of the voltage variable capacitors in the oscillation circuit 20 to the same potential to thereby disable the temperature compensation function, and the oscillation circuit 20 is then operated to oscillate at a predetermined oscillation capacitance. The other frequency control signals such as the room temperature frequency correction signal, the external input frequency control signal are also disabled.

When the constant voltage circuit 60 for bringing the driving voltage for the oscillation circuit 20 constant is provided, the constant voltage circuit 60 is controlled to drive the oscillation circuit 20 at a predetermined constant voltage. When the frequency division circuit 80 for dividing the frequency of the signal oscillated by the oscillation circuit 20 is provided, the frequency division circuit 80 is controlled to operate at a predetermined frequency division ratio.

This configuration allows the aforementioned adjustment work to be performed under the same conditions at all times.

Before the adjustment work for the oscillation frequency, the storage elements in the memory circuit 7 are generally in the state of all "0" or all "1" as long as nothing is written into the memory circuit 7, that is, in a predetermined state other than "101."

Figure 14:
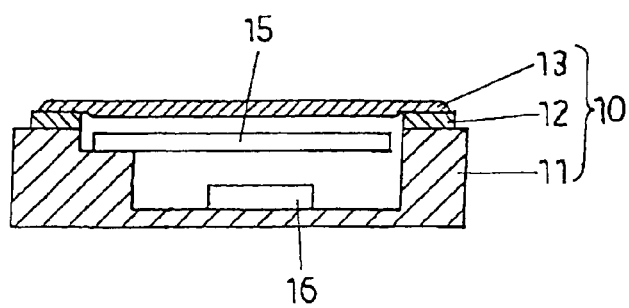
FIG. 14 is a schematic sectional view showing a configuration example of a package of the temperature compensation oscillator.

Steps of the adjustment work are as follows. The steps will be described referring to FIG. 14 being a configuration example of a single-type package which has been used for the description of the prior art.

Step 1

In a package main body 11, an IC chip 16 constituting the oscillation circuit 20 and the above-described circuits shown in each of the embodiments is mounted, and the quartz crystal 15 being the resonator is then mounted.

Step 2

The package main body 11 is kept at the reference temperature (generally room temperature: 25° C.), and both the terminals of the voltage variable capacitors in the oscillation circuit 20 are brought into the same potential as described above to disable the temperature compensation function to cause the oscillation circuit 20 to operate as a simple oscillator, and its oscillation frequency is adjusted to be a desired oscillation frequency of f0 by removing or adding the electrode film on the surface of the quartz crystal 15 while a frequency counter or the like is monitoring the oscillation frequency.

Step 3

A cover 13 is attached to the package main body 11 via a welding ring 12 and the quartz crystal 15 is hermetically sealed.

Step 4

The storage state of the storage elements in the memory circuit 7 shown in FIG. 9 is brought to "101" other than the predetermined state to enable the temperature compensation function, and the package 10 is then exposed to a plurality of temperatures and the oscillation frequency is measured at each of the temperature states to measure a difference with respect to the desired oscillation frequency f0.

Step 5

The temperature compensation data is created based on the measured values and written into a compensation data storage circuit (non-volatile memory) of the IC chip 16.

Accordingly, the temperature characteristic of the quartz crystal can be accurately adjusted without influence of the temperature compensation circuit while the oscillation circuit is oscillating as in the actual usage state, and the work to create the temperature compensation data and store it into the temperature compensation data storage circuit can also be subsequently appropriately performed. Therefore, it is possible to simplify and increase the accuracy of the adjustment process of the temperature compensation oscillator.

In order to more exactly match the oscillation frequency at room temperature to the nominal value, only the adjustment of the thickness of the electrode film on the quartz crystal 15 is insufficient, and therefore the package 10 is kept at the reference temperature (room temperature), and while a frequency counter or the like is monitoring the oscillation frequency of the oscillation circuit 20, the oscillation frequency is finely adjusted to match the nominal value by changing the room temperature frequency correction signal.

In Step 2, to keep the package main body 11 at the reference temperature (generally, room temperature: 25° C.), the adjustment work is preferably performed with the package main body 11 being placed in a constant temperature bath.

In step 4, to expose the package 10 to the plurality of temperature states, it is preferable to sequentially change the set temperature of the constant temperature bath or house the package 10 sequentially in a plurality of constant temperature baths set at different temperatures. The measurement temperature range is an operation guaranteed temperature range of this oscillator, and they are at, for example, appropriate points between minus 40° C. to plus 100° C. (for example, about 11 points).

The adjustment of the reference frequency of the quartz crystal 15 is performed by depositing a metal film such as silver or the like on the surface of the quartz crystal 15 in advance such that a film thickness (thick) is formed to bring the resonant frequency to be lower than the reference frequency, and applying ion beams using an ion gun to the electrode film on the surface of the quartz crystal 15 or performing sputter etching to decrease the mass of the electrode film little by little.

Conversely, the adjustment is performed by forming the film thickness of the metal film to a film thickness (thinner) to bring the resonant frequency to be higher than the reference frequency, and further depositing a metal such as silver or the like to the electrode film on the surface of the quartz crystal 15 to increase the mass of the electrode film little by little.

Note that this applies to the case where another piezoelectric element is used in place of the quartz crystal as the resonator of the oscillation circuit.

The temperature characteristic of the oscillation frequency of the oscillation circuit using an AT cut quartz crystal as a resonator forms almost a cubic curve, so that even if the oscillation frequency is adjusted to be the desired frequency f0 at the reference temperature, the oscillation frequency deviates when the environmental temperature changes. Hence, the temperature is actually changed from the lower limit to the upper limit of the operation guaranteed temperature range, and the actual oscillation frequency of the oscillation circuit, that is, the frequency of the oscillation output signal outputted to the output terminal 26 is measured at each of the temperature states (measurement points) to measure a difference with respect to the desired oscillation frequency f0.

Then, the temperature compensation data necessary for generating the temperature compensation signal (voltage signal) for bringing the difference to 0 in the temperature compensation circuit 30 is calculated and written into the compensation data storage circuit (non-volatile memory) 31 provided as in the prior art shown in FIG. 15 in a manner to correspond to the temperature data.

Note that more measurement points allow creation of temperature compensation data with higher accuracy but lengthen the measurement time, and therefore it is preferable to estimate the cubic curve of the temperature characteristic of the oscillation circuit from the measurement results at an appropriate number of temperature states (for example, about 11 points), and create temperature compensation data for temperatures between the measurement points by interpolation and write the data into the compensation data storage circuit.

In the above-described sixth embodiment (FIG. 9), the non-TCXO mode signal is generated based on the information stored in the memory circuit 7 to bring both terminals of the voltage variable capacitors 23 and 24 of the oscillation circuit 20' to the same potential to disable the temperature compensation function. Then, the non-TCXO mode signal is turned to "0" to enable the temperature compensation function when the storage state of the plurality of storage elements in the memory circuit 7 is "101," but the invention is not limited to this and it is also adoptable to establish the TCXO mode even in any storage state of the storage elements to enable or disable the temperature compensation function. Any number of digits of the storage data may be employed.

Incidentally, since the data in the initial state is usually likely to be all "1" or all "0" in the non-volatile memory or the like, it is preferable to bring the non-TCXO mode signal to "1" to disable the temperature compensation function when the data is "111" or "000" and to bring the non-TCXO mode signal to "0" to enable the temperature compensation function when a specific data other than the above is written thereinto.

However, it is allowed to establish the non-TCXO mode to disable the temperature compensation function in the storage state of the storage elements when specific data such as "101" is written into the memory circuit 7, and to establish the TCXO mode to enable the temperature compensation function when data other than the specific data such as "101" is written into the memory circuit 7 or the specific data is erased.

INDUSTRIAL APPLICABILITY

A temperature compensation oscillator and a method of manufacturing the same according to the invention are applicable to various temperature compensation oscillators and manufacture them, and are especially effective in increasing the accuracy and variety of micro temperature compensation oscillator using as a resonator an AT cut quartz crystal in heavy use in portable mobile communication devices such as a cellular phone and so on, and in increasing the efficiency of the initial adjustment work for the oscillation frequency at room temperature in the manufacturing process.

What is claimed is:

1. A temperature compensation oscillator comprising:
an oscillation circuit including a voltage variable capacitor;
a temperature detection circuit detecting a temperature around said oscillation circuit;
a temperature compensation signal generation circuit generating a voltage signal as a temperature compensation signal based on information of said temperature detection circuit, the voltage signal being supplied to said voltage variable capacitor to keep an oscillation frequency of said oscillation circuit substantially constant, and a controller bringing both terminals of said voltage variable capacitor to a same potential to allow said voltage variable capacitor to have a predetermined capacitance value when a signal to disable a temperature compensation function is inputted.

2. The temperature compensation oscillator according to claim 1, wherein said controller conducts a control to bring both the terminals to the same potential by applying the voltage signal being the temperature compensation signal to both the terminals of said voltage variable capacitor.

3. The temperature compensation oscillator according to claim 1, wherein said controller conducts a control to bring both the terminals to the same potential by bringing both the terminals of said voltage variable capacitor to a ground potential.

4. The temperature compensation oscillator according to claim 1, wherein said voltage variable capacitor has a characteristic to have a capacitance value substantially intermediate in a variable capacitance range in a state of both the terminals being at the same potential.

5. The temperature compensation oscillator according to claim 1 which further comprises a memory circuit,
wherein said controller conducts a control to bring both the terminals of said voltage variable capacitor to the same potential based on information stored in said memory circuit.

6. The temperature compensation oscillator according to claim 5,
wherein said memory circuit has a plurality of storage elements, and said controller conducts a control to bring both the terminals of said voltage variable capacitor to the same potential when a storage state of said plurality of storage elements is a predetermined state.

7. The temperature compensation oscillator according to claim 6 which further comprises a constant voltage circuit for keeping a driving voltage for said oscillation circuit constant,
wherein said constant voltage circuit conducts a control to bring the driving voltage to a predetermined voltage value when the storage state of said plurality of storage elements is the predetermined state.

8. The temperature compensation oscillator according to claim 6 which further comprises a frequency division circuit for dividing a frequency of a signal oscillated by said oscillation circuit,
wherein said frequency division circuit conducts a control to divide the frequency of the signal at a predetermined frequency division ratio when the storage state of said plurality of storage elements is the predetermined state.

9. The temperature compensation oscillator according to claim 1 which further comprises an external terminal for inputting a frequency control signal composed of a voltage signal,
wherein the frequency control signal inputted from said external terminal or a signal made by amplifying the frequency control signal is also supplied to said voltage variable capacitor.

10. The temperature compensation oscillator according to claim 1 which further comprises a room temperature frequency correction signal generation circuit generating a room temperature frequency correction signal being a voltage signal for correcting a deviation of the oscillation frequency at room temperature,
wherein the room temperature frequency correction signal is also supplied to said voltage variable capacitor.

11. The temperature compensation oscillator according to claim 1 which further comprises an external terminal for inputting a frequency control signal composed of a voltage signal; and
a room temperature frequency correction signal generation circuit generating a room temperature frequency correction signal being a voltage signal for correcting a deviation of the oscillation frequency at room temperature,
wherein the voltage signal supplied to said voltage variable capacitor is a signal made by combining the temperature compensation signal and one or both of the frequency control signal and the room temperature frequency correction signal.

12. A method for manufacturing a temperature compensation oscillator, said oscillator comprising an oscillation circuit including a voltage variable capacitor; a temperature detection circuit detecting a temperature around the oscillation circuit; and a temperature compensation signal generation circuit generating a voltage signal as a temperature compensation signal based on information of the temperature detection circuit, the voltage signal being supplied to the voltage variable capacitor to keep an oscillation frequency substantially constant,
wherein during assembly of the temperature compensation oscillator, an adjustment work for the oscillation frequency of the oscillation circuit at room temperature is performed by adjusting the thickness of an electrode on a resonator provided in the oscillation circuit with both terminals of the voltage variable capacitor being kept at a same potential to drive the oscillation circuit.

13. A method for manufacturing a temperature compensation oscillator, said oscillator comprising an oscillation circuit including a voltage variable capacitor; a temperature detection circuit detecting a temperature around the oscillation circuit; a temperature compensation signal generation circuit generating a voltage signal as a temperature compensation signal based on information of the temperature detection circuit; and a memory circuit, the voltage signal being supplied to the voltage variable capacitor to keep an oscillation frequency substantially constant,
wherein during assembly of the temperature compensation oscillator, writing to the memory circuit is not performed before an adjustment work for the oscillation frequency of the oscillation circuit at room temperature to keep a storage state in the memory circuit in a predetermined state, to allow the oscillation frequency adjustment work to be performed by adjusting the thickness of an electrode on a resonator provided in the oscillation circuit with both terminals of the voltage variable capacitor being kept at a same potential to drive the oscillation circuit.

* * * * *